United States Patent
Li et al.

(10) Patent No.: US 7,550,816 B2
(45) Date of Patent: Jun. 23, 2009

(54) FILLED TRENCH ISOLATION STRUCTURE

(75) Inventors: Li Li, Meridian, ID (US); Weimin Li, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 244 days.

(21) Appl. No.: 10/866,290

(22) Filed: Jun. 11, 2004

(65) Prior Publication Data
US 2004/0235263 A1 Nov. 25, 2004

Related U.S. Application Data

(62) Division of application No. 10/150,843, filed on May 17, 2002, now Pat. No. 6,777,308.

(51) Int. Cl.
*H01L 29/00* (2006.01)
(52) U.S. Cl. .................... 257/510; 257/506
(58) Field of Classification Search .............. 257/506, 257/510
See application file for complete search history.

(56) References Cited

U.S. PATENT DOCUMENTS

| | | | |
|---|---|---|---|
| 4,877,641 A * | 10/1989 | Dory .................. | 427/574 |
| 5,155,058 A * | 10/1992 | Fujiwara et al. ........... | 438/152 |
| 5,561,073 A * | 10/1996 | Jerome et al. ............. | 438/404 |
| 6,030,881 A | 2/2000 | Papasouliotis et al. | |
| 6,191,002 B1 * | 2/2001 | Koyanagi ................ | 438/431 |
| 6,194,038 B1 | 2/2001 | Rossman | |
| 6,211,040 B1 | 4/2001 | Liu et al. | |
| 6,291,341 B1 | 9/2001 | Sharan et al. | |
| 6,587,263 B1 * | 7/2003 | Iacovangelo et al. ...... | 359/359 |
| 2001/0036751 A1 | 11/2001 | Park et al. | |
| 2002/0040764 A1 | 4/2002 | Kwan et al. | |

\* cited by examiner

*Primary Examiner*—Long Pham
(74) *Attorney, Agent, or Firm*—Dinsmore & Shohl LLP

(57) ABSTRACT

A method for depositing a dielectric in a trench on a semiconductor substrate is provided. The dielectric is deposited by using an HDP-CVD system and performing a deposition of first and second layers of dielectric material. A first inert gas is utilized during the deposition of the first layer, and a second inert gas is utilized during the deposition of the second layer. Generally, a purge step is performed between the deposition of the first and second layers. The resulting dielectric layers are substantially free of voids and have low particle counts. Structures utilizing the filled trenches are also disclosed.

16 Claims, 4 Drawing Sheets

FILLED TRENCH ISOLATION STRUCTURE

CROSS REFERENCE TO RELATED APPLICATIONS

This application is a division of U.S. patent application Ser. No. 10/150,843 filed May 17, 2002, now U.S. Pat. No. 6,777,308.

BACKGROUND OF THE INVENTION

The present invention relates to a method for improving dielectric deposition and trench fill in semiconductor substrates or layers utilizing high-density plasma chemical vapor deposition (HDP-CVD). More particularly, the present invention is directed toward a method and system for improving the trench fill in shallow trench isolation (STI) structures.

Electronic devices such as field-effect transistors (FETs) are useful in fabricating integrated circuits such as those used in memory chips and microprocessors. The FETs used in high performance complementary metal oxide semiconductor (CMOS) circuits require advanced isolation techniques for filling recessed field oxide regions. One common isolation technique is known as local oxidation of silicon (LOCOS).

In LOCOS, a silicon nitride layer is deposited and patterned to leave islands of silicon nitride over on a semiconductor wafer. Silicon oxide is then grown on the areas of exposed silicon, and the silicon nitride is removed. This leaves wafer surface regions ready for device formation and separated by isolating regions of oxide. However, the use of LOCOS may cause isolation problems such as the formation of a bird's beak spur that grows under the edge of the blocking silicon nitride layer. This bird's beak takes up surface area, which is undesirable as circuit areas decrease. Additionally, the bird's beak induces stress damage in the silicon during the oxidation step from the mismatch in thermal expansion properties between silicon nitride and silicon.

An alternative to LOCOS is shallow trench isolation (STI). STI can solve the bird's beak problem. STI regions are used to isolate structures in semiconductor devices. The STI process begins with the formation of islands of nitride. A trench etch is then performed to trench the silicon around the islands of nitride. The trenches are filled with a dielectric such as an oxide to provide isolation regions. STI regions consume less silicon than other isolation methods. Thus, STI allows for smaller device geometry, and STI is generally used for sub 250 nm devices. Void free trench fill of oxides in STI trenches is extremely important for providing isolation. However, void free trench fill is difficult to achieve in STI trenches.

Chemical vapor deposition (CVD) has been used extensively to deposit dielectric material in trenches. During deposition, dielectric material will collect on the corners of the trenches, and overhangs will form at the corners. These overhangs typically grow together faster than the trench is filled, and a void in the dielectric material filling the gap is created. Many techniques have been utilized in attempts to solve the trench fill problem.

One technique which attempts to solve this problem is deposition and simultaneous etch back of the dielectric layer. This technique may be accomplished using HDP-CVD. Typically, HDP-CVD is carried out in a process chamber, such as an Ultima HDP-CVD® chamber, commercially available from Applied Materials (see U.S. Pat. No. 6,182,602 to Redecker et al.). Precursor gases such as silane and oxygen are flowed into the chamber along with an inert gas that is typically argon. A plasma is formed in a reaction zone proximate to the surface of the substrate by the application of radio frequency (RF) energy. The deposition gases disassociate and react to form a silicon dioxide layer. The relatively non-reactant inert gas is ionized and used to etch the silicon dioxide layer during deposition to keep the gaps open. The flow rates, RF power and other parameters are typically controlled to produce the desired rate of deposition and etch. In this manner, trenches in a semiconductor substrate may be successfully filled. However, such techniques do not always produce a void free trench fill. Additionally, HDP-CVD processes can cause particles to be deposited in the silicon dioxide layer. Particles may be deposited in the silicon dioxide layer from contaminants on the process chamber walls or from species that are formed in the plasma itself. Such particles are undesirable because they mar the smooth surface of the silicon dioxide layer and can compromise the insulating properties of the silicon dioxide.

Therefore, there is a need for a method of HDP-CVD that can produce a void free trench fill for trenches of varying depth and width in semiconductor substrates and layers. Additionally, there is a need for a method of HDP-CVD that balances the number of particles in the silicon dioxide layer with the need for void free gap fill. Finally, there is need for a method of HDP-CVD that can be successfully integrated with STI processes.

SUMMARY

This need is met by the present invention that provides a method for depositing trench-filling material and isolation structures having substantially void free trench fill. This method may be used in conjunction with conventional processing to provide structures requiring trench fill with a dielectric. The method is especially useful for shallow trench isolation structures.

In accordance with one embodiment, a method for filling a trench in a layer disposed in a process chamber is provided. The method comprises: providing a semiconductor layer having at least one trench therein; flowing a first precursor gas and a first inert gas into said process chamber and forming a first plasma therein; depositing a first layer of trench-filling material from said first plasma into said at least one trench; flowing a second precursor gas and second inert gas into said process chamber and forming a second plasma therein; and depositing a second layer of trench-filling material from said second plasma to substantially fill said at least one trench. The first inert gas is selected from the group consisting of helium, neon, argon, and krypton and combinations thereof, and the second inert gas is selected from the group consisting of helium, neon, argon, and krypton and combinations thereof. The first and second inert gases are typically selected to be different inert gases. The first inert gas is generally selected from the group consisting of helium and neon and combinations thereof, and the second inert gas is generally selected from the group consisting of argon and krypton and combinations thereof. The first precursor gas generally comprises a silicon precursor and an oxygen precursor, and the second precursor gas generally comprises a silicon precursor and an oxygen precursor. The trench filling material generally comprises silicon dioxide. The layer generally comprises a semiconductor substrate, or the layer may comprise silicon.

The process chamber may be purged of the first inert gas after the deposition of the first layer. The purging may be accomplished by terminating the first plasma after the deposition of the first layer. Alternatively, the purging may be accomplished by forming an oxygen plasma in the deposition chamber after the deposition of the first layer. In yet another embodiment, the purging may be accomplished by venting the first inert gas out of the process chamber after the deposition of the first layer.

Silane and molecular oxygen may comprise the first precursor gases. The silane may be flowed into the process chamber at a flow rate of about 1-150 sccm. Molecular oxygen may be flowed into the process chamber at a flow rate of about 10-300 sccm, and the first inert gas may be flowed into the chamber at a flow rate of about 1-2000 sccm. Typically, the first inert gas will be flowed into the chamber at a flow rate of about 200 sccm. Silane and molecular oxygen may comprise the second precursor gases. Silane may be flowed into the process chamber at a flow rate of about 1-150 sccm, and oxygen may be flowed into the process chamber at a flow rate of about 10-300 sccm. The second inert gas may be flowed into the chamber at a flow rate of about 1-2000 sccm. Typically, the second inert gas will be flowed into the chamber at a flow rate of about 200 sccm.

In an alternative embodiment, a method for a filling a trench in a layer comprises providing a semiconductor layer having at least one trench therein; placing the semiconductor layer in a first process chamber; flowing a first precursor gas and a first inert gas into the first process chamber and forming a first plasma therein, depositing a first layer of trench-filling material from the first plasma into the at least one trench; placing the semiconductor layer in a second process chamber; flowing a second precursor gas and a second inert gas into the second process and forming a second plasma therein; and depositing a second layer of trench-filling material from the second plasma so as to substantially fill the at least one gap. The first inert gas is selected from the group consisting of helium, neon, argon, and krypton and combinations thereof. The second inert gas is selected from the group consisting of helium, neon, argon, and krypton and combinations thereof. The first inert gas is generally selected from the group consisting of helium and neon and combinations thereof, and the second inert gas is generally selected from the group consisting of argon and krypton and combinations thereof. The first and second precursor gases may comprise a silicon precursor and an oxygen precursor. The trench-filling material generally comprises silicon dioxide.

Silane and molecular oxygen may comprise the first precursor gases. The silane may be flowed into the first process chamber at a flow rate of about 1-150 sccm. Molecular oxygen may be flowed into the first process chamber at a flow rate of about 10-300 sccm, and the first inert gas may be flowed into the first chamber at a flow rate of about 1-2000 sccm. Typically, the first inert gas will be flowed into the first chamber at a flow rate of about 200 sccm. Silane and molecular oxygen may comprise the second precursor gases. Silane may be flowed into the second process chamber at a flow rate of about 1-150 sccm, and oxygen may be flowed into the second process chamber at a flow rate of about 10-350 sccm. The second inert gas may be flowed into the second chamber at a flow rate of about 1-2000 sccm. Typically, the second inert gas will be flowed into the second chamber at a flow rate of about 200 sccm.

One method of forming a silicon dioxide layer filling trenches in a semiconductor wafer by HDP-CVD comprises: forming a first plasma, wherein the first plasma contains at least a silicon precursor gas, an oxygen precursor gas and a first inert gas selected from the group consisting of helium, neon, argon, and krypton and combinations thereof; exposing the wafer to the first plasma, wherein the step of exposing said wafer to said first plasma causes deposition of a first layer of silicon dioxide in said trenches in said wafer; forming a second plasma, wherein the second plasma contains at least a silicon precursor gas, an oxygen precursor gas and a second inert gas selected from the group consisting of helium, neon, argon, and krypton and combinations thereof; and exposing the wafer to the second plasma, wherein the step of exposing the wafer to the second plasma causes deposition of a second layer of silicon dioxide substantially filling the trenches in the wafer. The second inert gas is generally selected to be different from the first inert gas. Alternatively, the first plasma may be terminated before the formation of the second plasma. Additionally, oxygen plasma may be formed and then terminated after the wafer is exposed to the first plasma.

Another method of filling trenches in a substrate involves: creating a first plasma in a process chamber, wherein the first plasma comprises a silicon precursor gas, an oxygen precursor gas and a first inert gas selected from the group consisting of helium, neon, argon, and krypton and combinations thereof; depositing a first layer of trench-filling material into the trenches in the substrate; purging the process chamber of the first inert gas; creating a second plasma in the process chamber, wherein the second plasma comprises a silicon precursor gas, an oxygen precursor gas and a second inert gas selected from the group consisting of helium, neon, argon, and krypton and combinations thereof; and depositing a second layer of trench-filling material substantially filling the trenches in the substrate. The first inert gas is generally selected from the group consisting of helium and neon and combinations thereof, and the second inert gas is generally selected from the group consisting of argon and krypton and combinations thereof. The purging may comprise venting the process chamber. Alternatively, the purging may comprise creating an oxygen plasma in the process chamber after the deposition of the first layer, or the purging may comprise terminating the first plasma after the deposition of the first layer.

An alternative method of filling trenches in a substrate comprises: placing the substrate in a first process chamber; creating a first plasma in the first process chamber, wherein the first plasma comprises a silicon precursor gas, an oxygen precursor gas and a first inert gas selected from the group consisting of helium, neon, argon, and krypton and combinations thereof; depositing a first layer of trench-filling material into the trenches in the substrate; placing the substrate in a second process chamber; creating a second plasma in the second process chamber, wherein the second plasma comprises a silicon precursor gas, an oxygen precursor gas and a second inert gas selected from the group consisting of helium, neon, argon, and krypton and combinations thereof; and depositing a second layer of trench-filling material substantially filling the trenches in the substrate. The first inert gas is generally selected from the group consisting of helium and neon and combinations thereof, and the second inert gas is generally selected from the group consisting of argon and krypton and combinations thereof.

One method of filling shallow trench isolation trenches with silicon dioxide involves: providing a semiconductor substrate having shallow trench isolation trenches; placing the semiconductor substrate in a process chamber; creating a first plasma comprising a silicon precursor gas, an oxygen precursor gas and a first inert gas selected from the group consisting of helium, neon, argon, and krypton and combinations thereof; depositing a first silicon dioxide layer in the shallow trench isolation trenches; purging the process chamber of the first inert gas; creating a second plasma comprising a silicon precursor gas, an oxygen precursor gas and a second inert gas selected from the group consisting of helium, neon, argon, and krypton and combinations thereof; and depositing a second silicon dioxide layer substantially filling the shallow trench isolation trenches. The first inert gas is generally selected from the group consisting of helium and neon and combinations thereof, and the second inert gas is generally selected from the group consisting of argon and krypton and combinations thereof. The first and second silicon dioxide layers are substantially free of voids. The purging may comprise terminating the first plasma after the deposition of the first layer, or the purging may comprise forming an oxygen plasma in the deposition chamber after the deposition of the first layer. Alternatively, the purging may comprise venting the first inert gas out of the process chamber after the deposition of the first layer.

In one embodiment, a trench isolation structure formed in a semiconductor device is provided. The trench isolation structure comprises a semiconductor substrate having a plurality of trenches formed in the substrate. A pair of sidewalls and a bottom wall defines each of the trenches. Each of the trenches is filled with a silicon dioxide layer that is substantially free of voids. The silicon dioxide layer may be deposited by placing the semiconductor substrate in a process chamber, creating a first plasma in the process chamber, depositing a first layer of silicon dioxide into the trench, purging the process chamber of the first inert gas, creating a second plasma in said process chamber, and depositing a second layer of silicon dioxide substantially filling said trench. The first plasma may comprise a silicon precursor gas, an oxygen precursor gas and a first inert gas selected from the group consisting of helium, neon, argon, and krypton and combinations thereof. The second plasma may comprise a silicon precursor gas, an oxygen precursor gas and second inert gas selected from the group consisting of helium, neon, argon, and krypton and combinations thereof. The first inert gas is generally selected from the group consisting of helium and neon and combinations thereof, and the second inert gas is generally selected from the group consisting of argon and krypton and combinations thereof. The purging may be accomplished by terminating the first plasma, forming an oxygen plasma after the deposition of the first layer, or by venting the process chamber.

DETAILED DESCRIPTION OF THE PREFFERRED EMBODIMENTS

The present invention is directed to a method of filling trench regions in semiconductor devices and devices having the filled trenches. The method utilizes a two-step deposition of dielectric material to produce a filled trench substantially free of voids.

Figure 1:
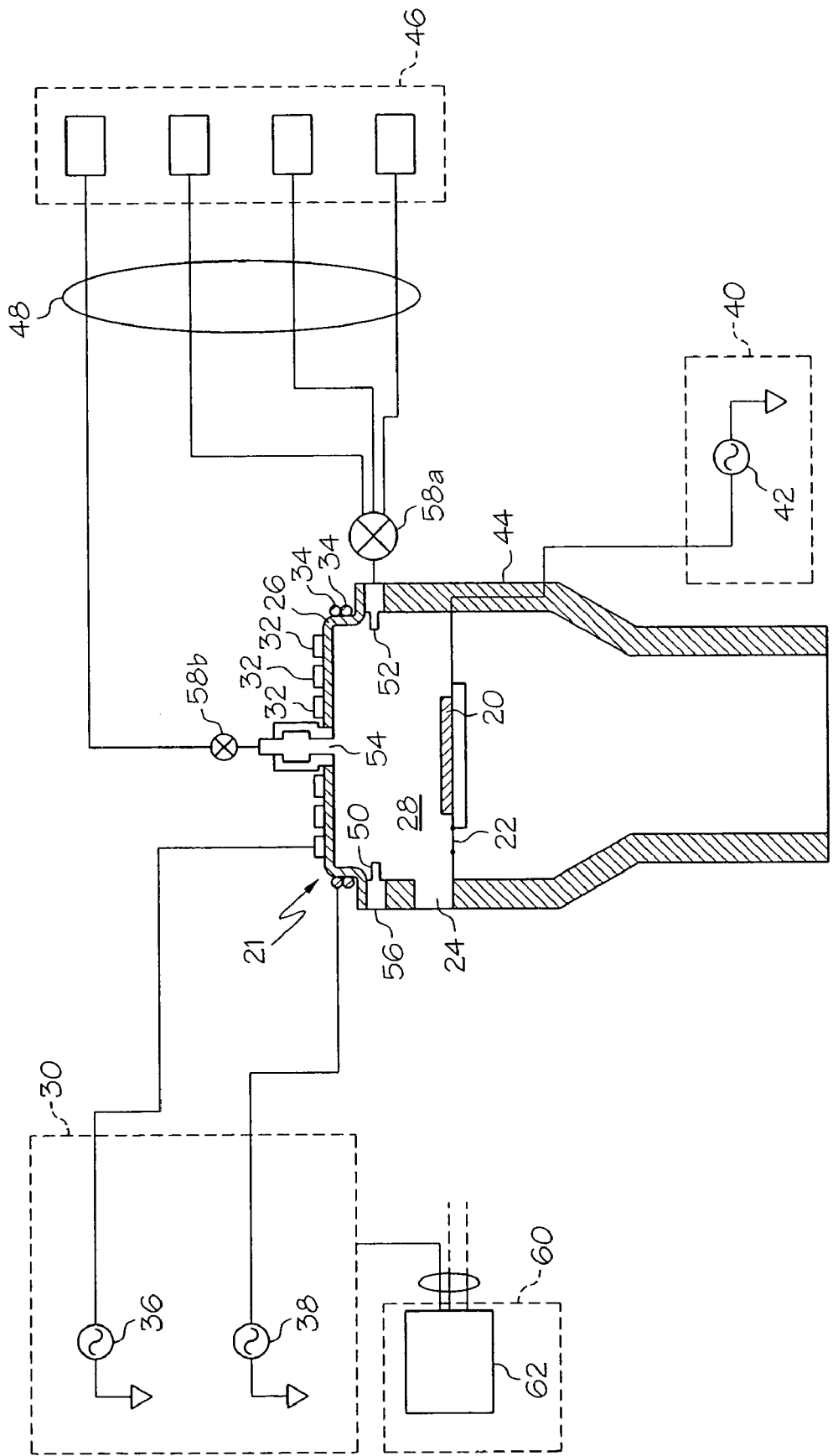
FIG. 1 is a schematic illustration of an exemplary HDP-CVD system.

The method of the present invention may be accomplished employing commercially available HDP-CVD systems. One such system is schematically illustrated in FIG. 1. A semiconductor substrate 20 is typically placed in a process chamber 21 on a substrate receiving portion 22 through an opening 24. The upper portion of the process chamber 21 generally comprises a dome 26 that defines an upper boundary of the plasma processing region 28. Such HDP-CVD systems generally include a source plasma system 30 that is used to strike a source plasma after gases are flowed into the process chamber 21. The source plasma system 30 may include a top coil 32 and a side coil 34 mounted on the dome 26. The top coil 32 and the side coil 34 are independently powered by RF source generators 36,38. The side coil 32 and top coil 34 couple energy into the chamber inductively. Such HDP-CVD systems further include a bias plasma system 40 that includes a RF bias generator 42. The bias plasma system 40 capacitively couples the substrate receiving portion 22 to a body member 44 and enhances the transport of plasma species created by the source plasma system 30 to the surface of the substrate 20.

Such HDP-CVD systems generally have a gas delivery system that includes a plurality of gas sources 46. The gases are introduced into the process chamber 21 through gas delivery lines 48 to a plurality of nozzles 50, 52, 54. Generally, the gases are introduced to a gas ring 56 having a plurality of nozzles of which only two 50 and 52 are shown. The gas ring 56 is generally located on the side of the process chamber 21. Additionally, another nozzle or nozzles 54 may be placed at the top of the process chamber 21. The gas delivery lines 48 may have valves 58a, 58b that allow the flow of gas to be controlled or vented. Generally, such HDP-CVD systems are controlled by a system controller 60 that includes a processor 62. For example, an Ultima HDP-CVD® system available commercially from Applied Materials incorporates many of the above features and may be configured to practice the present invention.

Figure 2:
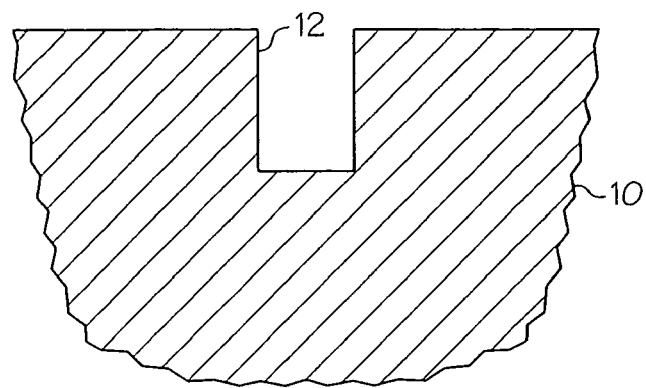
FIG. 2 is a partial cross-sectional view showing a typical trench for a trench isolation region for a semiconductor device.

FIG. 2 shows a semiconductor substrate 10 having a trench 12 therein. As used herein, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. Semiconductor substrate 10 is typically made of silicon or other semiconductive materials. Trench 12 may be formed in semiconductor substrate 10 by any process known to those skilled in the art. Typically, trench 12 is formed in semiconductor substrate 10 by a STI trench method. Trench 12 is generally formed to isolate a semiconductor structure from an adjacent semiconductor structure (not shown).

Figure 3:
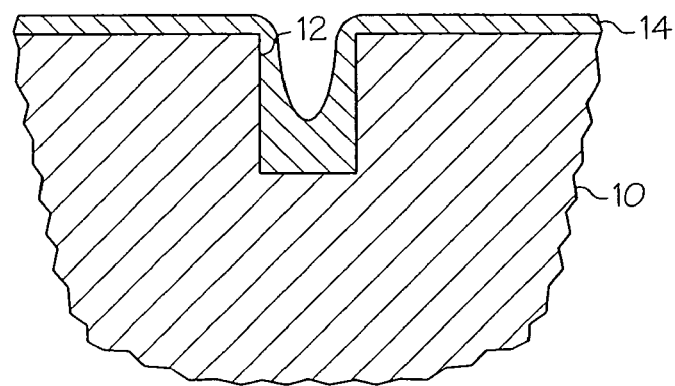
FIG. 3 is a partial cross-sectional view showing a first layer of trench-filling material in a trench.

Referring to FIG. 3, trench 12 is filled with a first layer of trench-filling material 14. The layer of trench-filling material 14 is deposited as discussed hereafter. The trench-filling material 14 generally comprises a dielectric material. Typically, the trench-filling material 14 will comprise silicon dioxide. The first layer of trench-filling material is deposited so as to partially fill the trench 12. The trench-filling material generally is deposited along the bottom of the trench 12 and on the sidewalls of the trench 12. Additionally, the trench-filling material 14.

Figure 4:
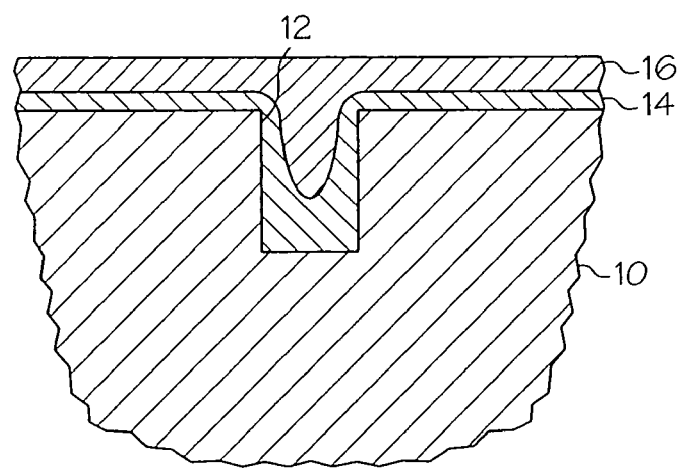
FIG. 4 is a partial cross-sectional view showing a second layer of trench-filling material in a trench.
Figure 5:
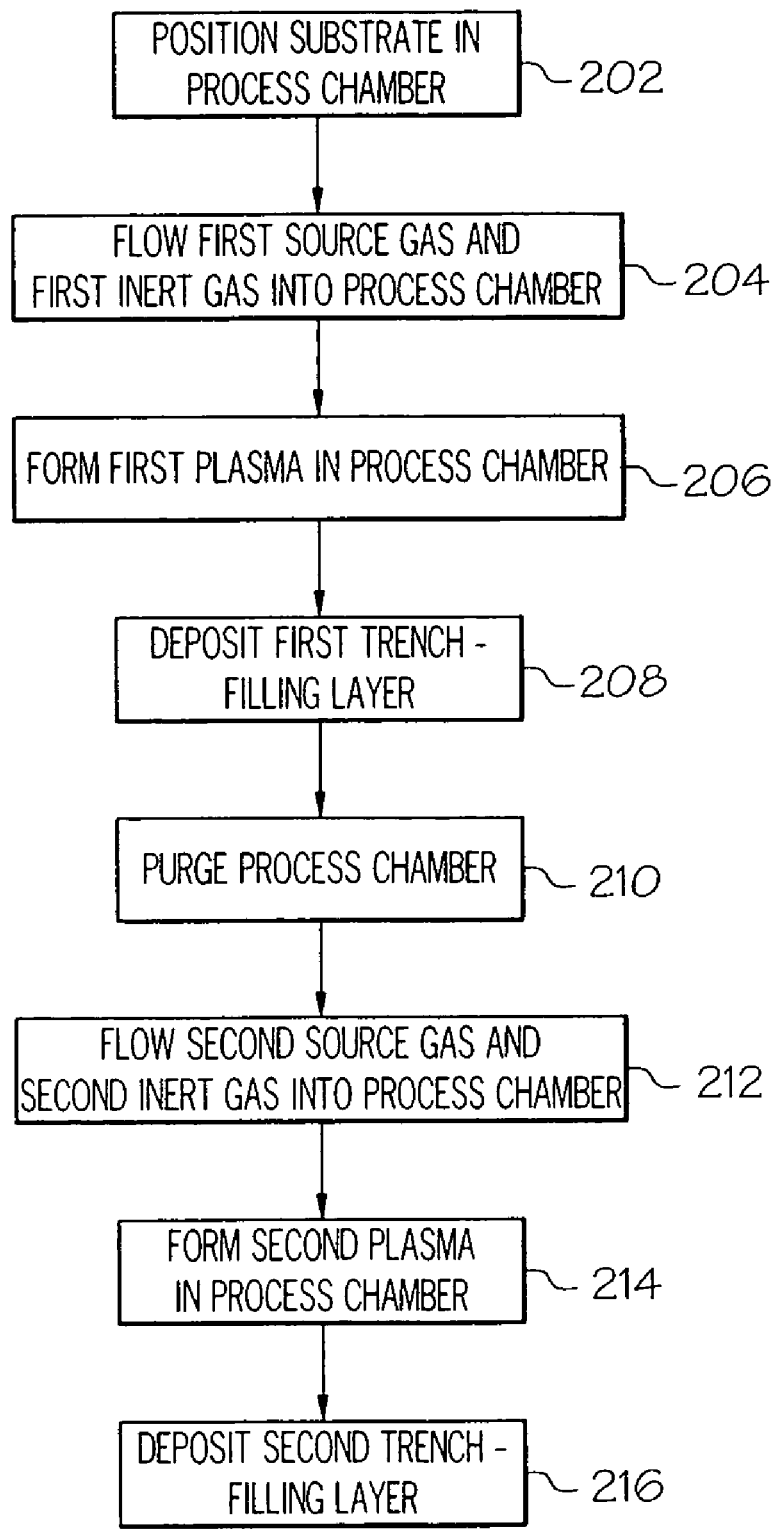
FIG. 5 is a flow diagram of one embodiment of the method in accordance with the present invention.
Figure 6:
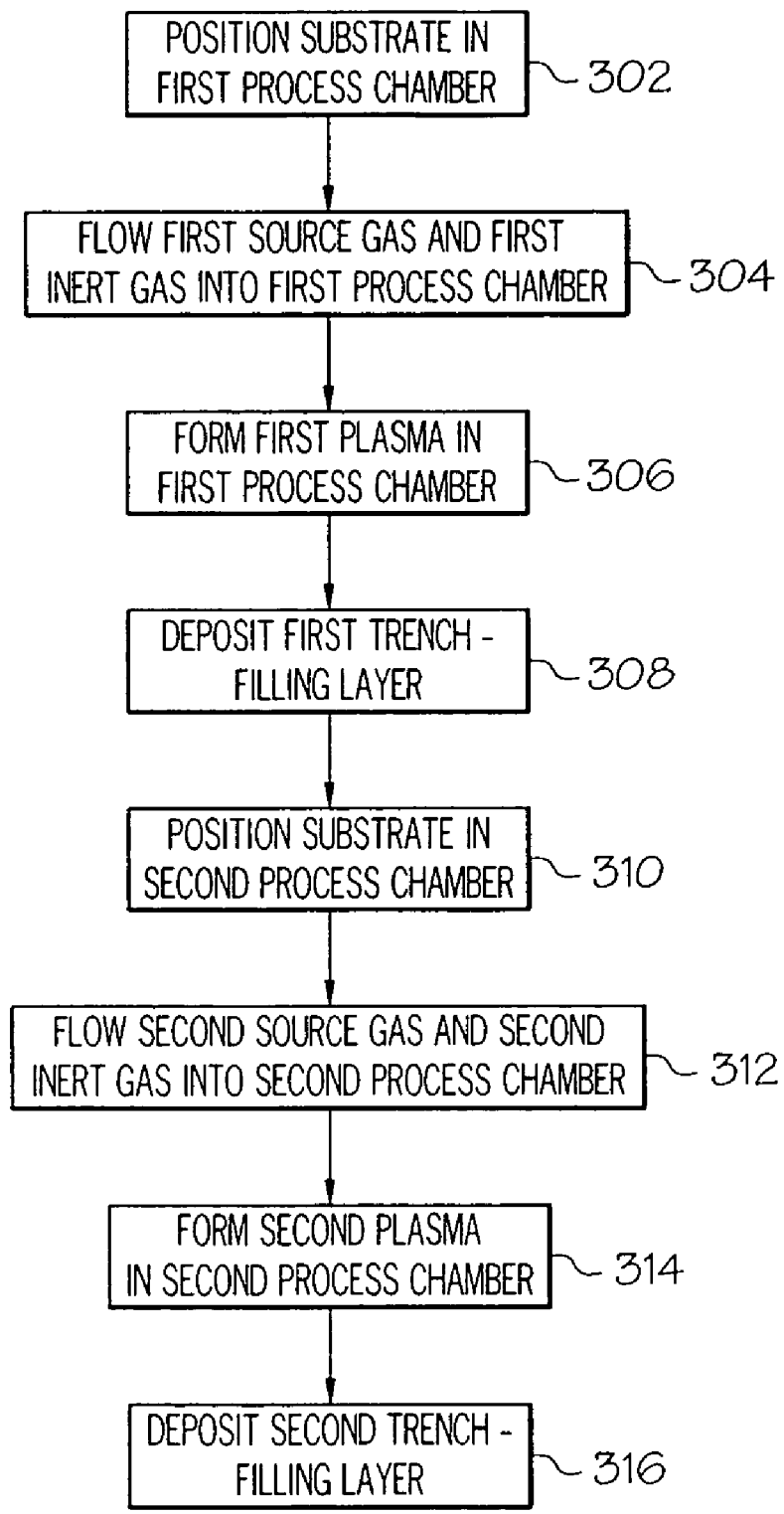
FIG. 6 is a flow diagram of an alternative embodiment of the method in accordance with the present invention.

Referring to FIG. 4, a second layer of trench-filling material 16 is deposited to substantially fill trench 12. The second layer of trench-filling material 16 is deposited as hereafter described. The trench-filling material 16 generally comprises a dielectric material, and the second layer 16 generally comprises silicon dioxide. The second layer 16 may also be deposited over the layer of trench-filling material 14 covering the surface of the semiconductor substrate 10. The second layer 16 generally provides a trench fill that is substantially free of voids.

Referring to FIGS. 2-4 and FIG. 5, one embodiment of the method includes the step 202 of positioning the semiconductor substrate in a process chamber. The semiconductor substrate 10 generally has at least one trench 12 therein. Subsequent to step 202, a first precursor gas and a first inert gas are flowed into the process chamber in step 204. Generally, the first precursor gas will comprise a silicon precursor gas and an oxygen precursor gas. The silicon precursor gas may comprise silane, disilane and other simple gases containing silicon. Typically, the first precursor gas will comprise silane and molecular oxygen. The first inert gas is selected from the group consisting of helium, neon, argon, krypton and combinations thereof. Typically, the first inert gas will be selected from the group consisting of neon, helium and combinations thereof, and the first inert gas is most typically neon. The first inert gas does not chemically react with the precursor gases. However, the first inert gas is ionized during the formation of the plasma and etches material that is deposited in subsequent step 206.

When silane and molecular oxygen are used as the precursor gases in an HDP-CVD system, the flow rate of silane into the process chamber is generally about 1-150 standard cubic centimeters per minute (sccm) for the top nozzle and about 1-150 sccm for the gas ring. Typically, the flow rate of silane will be about 28 sccm for the gas ring and about 6.75 sccm for the top nozzle. The flow rate of molecular oxygen into the process chamber is generally about 10-300 sccm for the gas ring. More typically, the flow rate of molecular oxygen will be about 75 sccm for the gas ring. The flow rate of the first inert gas is generally about 1-2000 sccm for the gas ring. Typically, the flow rate of the first inert gas is about 200 sccm for the gas ring.

In step 206, a first plasma is formed in the process chamber. In an HDP-CVD system, the RF power generally supplied during the formation of the first plasma is about 0-5000 W for the top coil, 0-3500 W for the side coil, and 200-1200 W for the bias. Typically, the RF power is about 4800 W for the top coil, about 2000 W for the side coil, and about 900 W for the bias. A first trench-filling layer 14 is deposited in the trench 12 in step 208 from the first precursor gas. The first trench-filling layer 14 generally comprises a dielectric that is typically silicon dioxide. During deposition of the first trench-filling layer 14, the first inert gas becomes ionized and a first etch is performed that directionally etches the silicon dioxide as it is being deposited. In this manner, the top of the trench 12 does not become pinched off by deposited material and a second layer 16 may be deposited in the trench 12. Typically, helium or neon gas will be used as the first inert gas. The helium and neon gases have relatively high ionization energies and low atomic masses. Therefore, the first etch has a low rate of sputtering or etching of the silicon dioxide when helium or neon gas is used. Generally, the trench 12 is filled to about half its depth during the deposition of the first trench-filling layer 14.

Subsequent to step 208, an optional purge step 210 is generally performed prior to the introduction of the second precursor and inert gases in step 212. The purge in step 210 is generally performed to prevent the direct mixing of the first inert gas with the second inert gas from step 212. Although the first and second precursor gases may be the same, the first and second inert gases are different inert gases. It is desirable to prevent the direct mixing of the first and second inert gases because fewer particles are deposited in the trench-filling material that fills the trench 12 if the process chamber is purged prior to step 212. Particles may be deposited in the film from the walls of the process chamber or from the plasma itself. Particles may be metals from the dome or wall of the process chamber or polymers formed in the plasma. Particles in the trench-filling material are undesirable because they introduce impurities into the film and may reduce the insulating properties of the dielectric. However, the particles generally cannot be entirely eliminated, and conditions are adjusted to keep the particle counts low while still achieving substantially void free fill of trench 12.

The purging may be accomplished in several ways. The process chamber may be purged of the first inert gas by performing a no power purge. The no power purge is accomplished by terminating the first plasma formed in step 206 after the deposition of the first trench-filling layer 14. After the plasma is terminated, a sufficient amount of time is allowed to pass before the introduction of the gases in step 212 to minimize the amount of direct mixing of the first inert gas with the second inert gas from step 212. Generally, the plasma will be terminated for from about one second to about sixty seconds. Typically the plasma will be terminated for from about one to about ten seconds.

The purge in step 210 may alternatively be performed by forming an oxygen plasma in the process chamber subsequent to the deposition of the first trench-filling layer in step 208. The presence of the oxygen plasma purges the process chamber of the first inert gas, and the formation of an oxygen plasma maintains the temperature of the semiconductor substrate 10 during processing. The oxygen plasma may be formed by flowing molecular oxygen gas into the process chamber and applying RF side and top coil power. Generally, the oxygen plasma will be formed for from about one second to about sixty seconds. Typically the oxygen plasma will be formed for from about one to about ten seconds.

In an alternative embodiment, the purge in step 210 is accomplished by venting the process chamber after the deposition of the first trench-filling layer in step 208. The venting may be accomplished by venting the process chamber to the air or by removing the semiconductor substrate from the process chamber and then placing the semiconductor substrate back in the process chamber prior to step 212. Again, the venting of the chamber prevents the direct mixing of the first inert gas with the second inert gas from step 212.

A second precursor gas and a second inert gas are flowed into the process chamber in step 212. Generally, the second precursor gas will comprise a silicon precursor gas and an oxygen precursor gas. The silicon precursor gas may be silane or disilane. Typically, the second precursor gas will comprise silane and molecular oxygen. Thus, the first and second precursor gases may be the same. However, the first and second precursor gases may comprise different precursor gases. The second inert gas is selected from the group consisting of helium, neon, argon, and krypton and combinations thereof. The second inert gas is typically selected to be a different inert gas than the first inert gas. Typically, the second inert gas will be selected from the group consisting of argon and krypton and combinations thereof. More typically, the second inert gas is argon. The second inert gas does not chemically react with the precursor gases. However, second inert gas is ionized during the formation of the plasma and etches material that is deposited in subsequent step 216.

When silane and molecular oxygen are used as the second precursor gases in an HDP-CVD system, the flow rate of silane into the process chamber is generally about 1-150 sccm for the gas ring and about 1-150 sccm for the top nozzle. Typically, the flow rate of silane will be about 28 sccm for the gas ring and about 6.75 sccm for the top nozzle. The flow rate of molecular oxygen into the process chamber is generally about 10-300 sccm for the gas ring. More typically, the flow rate of molecular oxygen will be about 75 sccm for the gas ring. The flow rate of the second inert gas is generally about 1-2000 sccm for the gas ring. Typically, the flow rate of the second inert gas is about 200 sccm for the gas ring.

After step 212, a second plasma is formed in the process chamber in step 214. Generally, the RF power supplied in a HDP-CVD system during the formation of the second plasma is about 0-5000 W for the top coil, 0-3500 W for the side coil, and 200-1200 W for the bias. Typically, the RF power is about 4800 W for the top coil, about 2000 W for the side coil, and about 900 W for the bias. Once the plasma has been struck by the application of the RF power, a second trench-filling layer 16 is deposited in the trench 10 in step 216 from the precursor gases. The second trench-filling layer is a dielectric. Typically, the second trench-filling layer comprises silicon dioxide. During the deposition of the second trench-filling layer 16, the second inert gas becomes ionized and etches the silicon dioxide. This keeps the top of the trench 12 open, and allows for a substantially void-free gap fill. Typically, argon or krypton will be selected as the second inert gas. Argon and krypton have lower ionization energies than helium or neon, and argon and krypton have higher atomic masses than helium or neon. Therefore, the etch performed during step 216 using krypton or argon has a higher rate of sputtering or etch than the etch performed during step 208 using helium or neon.

Referring to FIGS. 2-4 and FIG. 6, an alternative method according to another embodiment of the invention includes the step 302 of positioning a substrate having at least one trench in a first process chamber. A first precursor gas and a first inert gas are flowed into the first process chamber in step 304, and a first plasma is formed in the first process chamber in step 306. The first precursor gas is generally a silicon precursor gas and an oxygen precursor gas. More typically, the first precursor gas comprises silane and molecular oxygen. The first inert gas is selected from the group consisting of helium, neon, argon, krypton and combinations thereof. Typically, the first inert gas will be selected from the group consisting of neon, helium and combinations thereof, and the first inert gas is most typically neon. When an HDP-CVD system is used, the flow rates of the silane, molecular oxygen, and the first inert gas are those described in connection with step 204, and the RF powers are those described in connection with step 206. A first trench-filling layer 14 is deposited in the trenches 12 in step 308. The trench-filling layer is a dielectric that generally comprises silicon dioxide.

The substrate is then removed from the first process chamber and positioned in a second process chamber in step 310, and a second precursor gas and a second inert gas are flowed into the second process chamber in step 312. The second precursor gas is generally a silicon precursor gas and an oxygen precursor gas. More typically, second precursor gas comprises silane and molecular oxygen. The second inert gas is selected from the group consisting of helium, neon, argon, and krypton and combinations thereof. The second inert gas is typically selected to be a different inert gas than the first inert gas. Typically, the second inert gas will be selected from the group consisting of argon and krypton and combinations thereof. More typically, the second inert gas is argon. A second plasma is formed in the second process chamber in step 314, and a second trench-filling layer 16 is deposited in step 316. In an HDP-CVD system, the flow rates of silane, molecular oxygen, and the second precursor gas are those described in connection with step 212. The RF energies that are applied to strike the plasma are those described in connection with step 214. The second trench-filling layer 16 is a dielectric, and the dielectric is generally silicon dioxide. The step 310 of positioning the substrate in a second process chamber prevents the first and second inert gases from mixing, and the particle count in the dielectric layer is thus reduced.

EXAMPLE 1

A silicon dioxide film was deposited in shallow trench isolation trenches in accordance with the present invention using an Applied Ultima HDP-CVD® system. The first precursor gas was a silane gas and a molecular oxygen gas. The first inert gas was neon. During deposition of the first silicon dioxide layer, the flow rate of silane was 28 sccm for the gas ring and 6.75 sccm for the top nozzle. The flow rate of molecular oxygen into the process chamber was 75 sccm for the gas ring, and the flow rate of neon was 200 sccm for the gas ring. The RF power was 4800 W for the top coil, 2000 W for the side coil, and 900 W for the bias.

The second precursor gas was a silane gas and a molecular oxygen gas. The second inert gas was argon. During deposition of the second silicon dioxide layer, the flow rate of silane was 28 sccm for the gas ring and 6.75 sccm for the top nozzle. The flow rate of molecular oxygen into the process chamber was 75 sccm for the gas ring, and the flow rate of argon was 200 sccm for the gas ring. The RF power was 4800 W for the top coil, 2000 W for the side coil, and 900 W for the bias. No purge was performed. The particle count, as measured using a laser system, was a total of 1754 particles larger than 0.1 µm.

EXAMPLE 2

A silicon dioxide film was deposited in shallow trench isolation trenches in accordance with the present invention using an Applied Ultima HDP-CVD® system. The first precursor gas was a silane gas and a molecular oxygen gas. The first inert gas was neon. During the formation of the first plasma and deposition of the first silicon dioxide layer, the flow rate of silane was 28 sccm for the gas ring and 6.75 sccm for the top nozzle. The flow rate of molecular oxygen into the process chamber was 75 sccm for the gas ring, and the flow rate of neon was 200 sccm for the gas ring. The RF power was 4800 W for the top coil, 2000 W for the side coil, and 900 W for the bias.

A no power purge was performed after the deposition of the first layer during which the first plasma was terminated for ten seconds.

The second precursor gas was a silane gas and a molecular oxygen gas. The second inert gas was argon. During the formation of the second plasma and deposition of the second silicon dioxide layer, the flow rate of silane was 28 sccm for the gas ring and 6.75 sccm for the top nozzle. The flow rate of molecular oxygen into the process chamber was 75 sccm for the gas ring, and the flow rate of argon was 200 sccm for the gas ring. The RF power was 4800 W for the top coil, 2000 W for the side coil, and 900 W for the bias. The particle count, as measured using a laser system, was 258 particles larger than 0.1 µm.

It will be obvious to those skilled in the art that various changes may be made without departing from the scope of the invention, which is not to be considered limited to what is described in the specification.

The invention claimed is:

1. A filled trench isolation structure formed in a semiconductor device comprising:
   a semiconductor substrate;

at least one trench formed in said semiconductor substrate, said at least one trench being defined by a pair of sidewalls and a bottom wall and being filled with first and second deposited layers of trench-filling materials formed by:
  placing said semiconductor substrate in a process chamber;
  creating a first plasma in said process chamber, wherein said first plasma comprises a silicon precursor gas, an oxygen precursor gas and a first inert gas selected from the group consisting of helium, neon, argon, and krypton and combinations thereof;
  exposing said semiconductor substrate to said first plasma to cause deposition of said first layer of trench-filling material into said trench so as to partially fill said trench;
  purging said process chamber of said first inert gas;
  creating a second plasma in said process chamber, wherein said second plasma comprises a silicon precursor gas, an oxygen precursor gas and second inert gas selected from the group consisting of helium, neon, argon, and krypton and combinations thereof;
  exposing said semiconductor substrate to said second plasma to cause deposition of said second layer of trench-filling material on said first layer of trench-filling material substantially filling said trench such that said filled trench is substantially free of voids.

2. The trench isolation structure as claimed in claim 1 wherein said first inert gas is selected from the group consisting of helium and neon and combinations thereof, and wherein said second inert gas is selected from the group consisting of argon and krypton; and wherein during deposition of said first layer said first inert gas becomes ionized and etches said first layer as it is deposited such that the top of said trench remains open; and wherein during deposition of said second layer said second inert gas becomes ionized and etches said second layer as it is deposited such that the top of said trench remains open and such that said filled trench is substantially free of voids.

3. A filled trench isolation structure formed in a semiconductor device comprising:
  a semiconductor substrate;
  a plurality of trenches formed in said semiconductor substrate, each said trench:
    being defined by a pair of sidewalls and a bottom wall; and
    being filled with first and second silicon dioxide layers formed by successive high density plasma-chemical vapor deposition processes using first and second inert gases, wherein said filled trench is substantially free of voids.

4. A filled trench isolation structure formed in a semiconductor device comprising:
  a semiconductor substrate;
  a plurality of trenches formed in said semiconductor substrate, each said trench
    being defined by a pair of sidewalls and a bottom wall;
    being partially filled with a first silicon dioxide layer substantially free of voids that is deposited conformally on said sidewalls and said bottom wall by:
      placing said semiconductor substrate in a process chamber;
      creating a first plasma in said process chamber, wherein said first plasma comprises a silicon precursor gas, an oxygen precursor gas and a first inert gas selected from the group consisting of helium, neon, argon, and krypton and combinations thereof;
      exposing said semiconductor substrate to said first plasma to cause deposition of said first layer of silicon dioxide into said trench so as to partially fill said trench; and
      purging said process chamber;
    being filled with a second silicon dioxide layer substantially free of voids that is deposited to substantially fill said trench by:
      creating a second plasma in said process chamber, wherein said second plasma comprises a silicon precursor gas, an oxygen precursor gas and a second inert gas selected from the group consisting of helium, neon, argon, and krypton and combinations thereof;
      exposing said semiconductor substrate to said second plasma to cause deposition of said second layer of silicon dioxide.

5. The trench isolation structure as claimed in claim 4 wherein said first inert gas is selected from the group consisting of helium and neon and combinations thereof, and wherein said second inert gas is selected from the group consisting of argon and krypton; and wherein during deposition of said first layer said first inert gas becomes ionized and etches said first layer as it is deposited such that the top of said trench remains open; and wherein during deposition of said second layer said second inert gas becomes ionized and etches said second layer as it is deposited such that the top of said trench remains open and such that said filled trench is substantially free of voids.

6. A filled trench isolation structure formed in a semiconductor device comprising:
  a semiconductor substrate;
  a plurality of trenches formed in said semiconductor substrate, each said trench:
    being defined by a pair of sidewalls and a bottom wall; and
    being filled with first and second silicon dioxide layers deposited by:
      placing said semiconductor substrate in a process chamber;
      creating a first plasma in said process chamber, wherein said first plasma comprises a silicon precursor gas, an oxygen precursor gas and a first inert gas selected from the group consisting of helium, neon, argon, and krypton and combinations thereof;
      exposing said semiconductor substrate to said first plasma to cause deposition of said first layer of silicon dioxide into said trench so as to partially fill said trench;
      purging said process chamber of said first inert gas by terminating said first plasma;
      creating a second plasma in said process chamber, wherein said second plasma comprises a silicon precursor gas, an oxygen precursor gas and a second inert gas selected from the group consisting of helium, neon, argon, and krypton and combinations thereof;
      exposing said semiconductor substrate to said second plasma to cause deposition of said second layer of silicon dioxide substantially filling said trench.

7. The trench isolation structure as claimed in claim 6 wherein said first inert gas is selected from the group consisting of helium and neon and combinations thereof, and wherein said second inert gas is selected from the group consisting of argon and krypton; and wherein during deposition of said first layer said first inert gas becomes ionized and etches said first layer as it is deposited such that the top of said trench remains open; and wherein during deposition of said second layer said second inert gas becomes ionized and etches said second layer as it is deposited such that the top of said trench remains open and such that said filled trench is substantially free of voids.

8. A filled trench isolation structure formed in a semiconductor device comprising:
   a semiconductor substrate;
   a plurality of trenches formed in said semiconductor substrate, each said trench:
      being defined by a pair of sidewalls and a bottom wall; and
      being filled with first and second silicon dioxide layers deposited by:
         placing said semiconductor substrate in a process chamber;
         creating a first plasma in said process chamber, wherein said first plasma comprises a silicon precursor gas, an oxygen precursor gas and a first inert gas comprising helium, neon, argon, and krypton and combinations thereof;
         exposing said semiconductor substrate to said first plasma to cause deposition of said first layer of silicon dioxide into said trench so as to partially fill said trench;
         purging said process chamber of said first inert gas by forming an oxygen plasma in said process chamber;
         creating a second plasma in said process chamber, wherein said second plasma comprises a silicon precursor gas, an oxygen precursor gas and second inert gas comprising helium, neon, argon, and krypton and combinations thereof;
         exposing said semiconductor substrate to said second plasma to cause deposition of said second layer of silicon dioxide substantially filling said trench.

9. The trench isolation structure as claimed in claim 8 wherein said first inert gas is selected from the group consisting of helium and neon and combinations thereof, and wherein said second inert gas is selected from the group consisting of argon and krypton; and wherein during deposition of said first layer said first inert gas becomes ionized and etches said first layer as it is deposited such that the top of said trench remains open; and wherein during deposition of said second layer said second inert gas becomes ionized and etches said second layer as it is deposited such that the top of said trench remains open and such that said filled trench is substantially free of voids.

10. A filled trench isolation structure formed in a semiconductor device comprising:
   a semiconductor substrate;
   a plurality of trenches formed in said semiconductor substrate, each said trench:
      being defined by a pair of sidewalls and a bottom wall; and
      being filled with first and second silicon dioxide layers deposited by:
         placing said semiconductor substrate in a process chamber;
         creating a first plasma in said process chamber, wherein said first plasma comprises a silicon precursor gas, an oxygen precursor gas and a first inert gas selected from the group consisting of helium, neon, argon, and krypton and combinations thereof;
         exposing said semiconductor substrate to said first plasma to cause deposition of said first layer of silicon dioxide into said trench so as to partially fill said trench;
         purging said process chamber of said first inert gas by venting said process chamber;
         creating a second plasma in said process chamber, wherein said second plasma comprises a silicon precursor gas, an oxygen precursor gas and second inert gas selected from the group consisting of helium, neon, argon, and krypton and combinations thereof;
   exposing said semiconductor substrate to said second plasma to cause deposition of said second layer of silicon dioxide substantially filling said trench.

11. The trench isolation structure as claimed in claim 10 wherein said first inert gas is selected from the group consisting of helium and neon and combinations thereof, and wherein said second inert gas is selected from the group consisting of argon and krypton; and wherein during deposition of said first layer said first inert gas becomes ionized and etches said first layer as it is deposited such that the top of said trench remains open; and wherein during deposition of said second layer said second inert gas becomes ionized and etches said second layer as it is deposited such that the top of said trench remains open and such that said filled trench is substantially free of voids.

12. The trench isolation structure of claim 1 wherein said first layer of trench-filling material fills about half the depth of said trench.

13. The trench isolation structure of claim 4 wherein said first layer of silicon dioxide fills about half the depth of said trench.

14. The trench isolation structure of claim 6 wherein said first layer of silicon dioxide fills about half the depth of said trench.

15. The trench isolation structure of claim 8 wherein said first layer of silicon dioxide fills about half the depth of said trench.

16. The trench isolation structure of claim 10 wherein said first layer of silicon dioxide fills about half the depth of said trench.

* * * * *